(12) United States Patent
Park et al.

(10) Patent No.: US 8,163,591 B2
(45) Date of Patent: Apr. 24, 2012

(54) BACKSIDE ILLUMINATED IMAGE SENSOR

(75) Inventors: Sung-Hyung Park, Chungcheongbuk-do (KR); Ju-Il Lee, Chungcheongbuk-do (JP)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 12/956,975

(22) Filed: Nov. 30, 2010

(65) Prior Publication Data

US 2011/0108709 A1     May 12, 2011

Related U.S. Application Data

(62) Division of application No. 12/216,065, filed on Jun. 27, 2008, now Pat. No. 7,847,326.

(30) Foreign Application Priority Data

Jun. 29, 2007   (KR) .............................. 2007-0065368

(51) Int. Cl.
*H01L 21/00* (2006.01)
(52) U.S. Cl. .............. 438/72; 438/57; 438/73; 438/200; 438/527; 257/E21.122; 257/E27.112; 257/E27.133; 257/E27.152; 257/E31.084
(58) Field of Classification Search .................... 438/57, 438/72–73, 200, 527; 257/E21.122, 27.112, 257/131–133, 152, E31.007, 84–89, 93
See application file for complete search history.

(56) References Cited

U.S. PATENT DOCUMENTS

| | | | |
|---|---|---|---|
| 4,875,084 A | 10/1989 | Tohyama | |
| 7,005,315 B2 * | 2/2006 | Hong et al. | 438/73 |
| 7,667,178 B2 * | 2/2010 | Bae et al. | 250/208.1 |
| 7,847,326 B2 * | 12/2010 | Park et al. | 257/292 |
| 2005/0056902 A1 | 3/2005 | Abe et al. | |
| 2006/0086956 A1 | 4/2006 | Furukawa | |
| 2006/0125038 A1 | 6/2006 | Mabuchi | |
| 2007/0001100 A1 | 1/2007 | Hsu et al. | |
| 2007/0139542 A1 | 6/2007 | Ohkubo et al. | |
| 2008/0135963 A1 | 6/2008 | Akiyama | |
| 2009/0090937 A1 * | 4/2009 | Park | 257/252 |
| 2010/0271524 A1 * | 10/2010 | Venezia et al. | 348/308 |

FOREIGN PATENT DOCUMENTS

| | | |
|---|---|---|
| JP | 1082667 | 3/1989 |
| JP | 2006261372 | 9/2006 |

OTHER PUBLICATIONS

English Translation of Office Action issued Aug. 14, 2009 in Chinese Patent Application 200810127544.
European Search Report, dated Nov. 16, 2010.

* cited by examiner

*Primary Examiner* — Michael Lebentritt
(74) *Attorney, Agent, or Firm* — McAndrews, Held & Malloy, Ltd.

(57) ABSTRACT

A backside illuminated image sensor includes a photodiode, formed below the top surface of a semiconductor substrate, for receiving light illuminated from the backside of the semiconductor substrate to generate photoelectric charges, a reflecting gate, formed on the photodiode over the front upper surface of the semiconductor substrate, for reflecting light illuminated from the backside of the substrate and receiving a bias to control a depletion region of the photodiode, and a transfer gate for transferring photoelectric charges from the photodiode to a sensing node of a pixel.

27 Claims, 2 Drawing Sheets

BACKSIDE ILLUMINATED IMAGE SENSOR

CROSS-REFERENCE TO RELATED APPLICATIONS

The present invention claims priority of Korean patent application number 2007-0065368, filed on Jun. 29, 2007, which is incorporated by reference in its entirety.

BACKGROUND OF THE INVENTION

The present invention relates to an image sensor, and more particularly, to a backside illuminated image sensor, which can be applied to an active pixel sensor (APS) such as a complementary metal oxide semiconductor (CMOS) image sensor or a charge coupled device (CCD) image sensor.

An image sensor is a semiconductor device that converts an optical image into an electrical signal. The image sensor includes a light receiving part (generally referred to as a photodiode) for sensing light, and a logic circuit part for processing the sensed light into electrical signals.

A pixel of an image sensor includes a photodiode for receiving light to generate photoelectric charges, and a charge transfer gate for transferring the photoelectric charges to a sensing node of the pixel.

A conventional image sensor has a front illumination configuration, in which a photodiode is formed below a substrate surface and logic circuits are formed on the substrate, so that light is illuminated on the top surface of the substrate. However, the photo response characteristic of the photodiode is poor because multiple upper layers formed on the photodiode cause light loss. Also, it is difficult to covert incident light flux into photoelectric charges because the penetration depth of photons is large.

To overcome these limitations, a backside illuminated image sensor has been proposed which illuminates a substrate from the rear surface thereof.

FIG. 1 is a sectional view of a conventional backside illuminated image sensor disclosed in US Patent Publication No. 2006-0068586A1.

Referring to FIG. 1, an n-well 120 serving as a junction cathode is formed on a p-type silicon 130 by performing a predetermined process on a silicon-on-insulator (SOI) wafer having a silicon/buried oxide/silicon structure, and a logic circuit (not shown) and metal lines 150 are formed thereon. A supporting substrate 140 is attached, and the silicon on the rear surface of the SOI wafer is polished until the buried oxide layer. An anti-reflecting layer 220 and a microlens 230 are formed on the resulting structure. Therefore, photons are incident from the rear surface of the substrate. The conventional backside illuminated image sensor further includes a p-type ion injection region 125 for preventing cross-talk, and first and second insulation layers 160A and 160B.

However, a metal reflector 240 must be separately provided at a position corresponding to the photodiode, in order to reduce signal loss caused when long-wavelength light passes through the silicon (substrate) whose thickness is reduced. Therefore, a metal process must be added or limitations must be imposed on a metal layout.

Additionally, in the convention backside illuminated image sensor, the internal potential of the photodiode is determined according to processing conditions (doping concentrations, depths, etc.) and the width of the depletion region is determined. Accordingly, when a depletion region is not formed near the rear surface of the substrate, the cross-talk is generated. That is, photoelectric charges generated around the rear surface of the substrate do not reach the depletion region of the photodiode and move to a neighboring pixel. Also, sensitivity to short wavelength is poor.

SUMMARY OF THE INVENTION

Embodiments of the present invention are directed to providing a backside illuminated image sensor that does not require a separate metal reflective layer.

Embodiments of the present invention are also directed to providing a backside illuminated image sensor, which can control the width of a depletion region of a photodiode, thereby improving cross-talk characteristics.

Embodiments of the present invention are further directed to providing a backside illuminated image sensor with improved efficiency and timing margin in transferring photoelectric charges generated by a photodiode to a sensing node of a pixel.

In accordance with an aspect of the present invention, there is provided a backside illuminated image sensor including a photodiode, formed below the top surface of a semiconductor substrate, for receiving light illuminated from the backside of the semiconductor substrate to generate photoelectric charges, a reflecting gate, formed on the photodiode over the front upper surface of the semiconductor substrate, for reflecting light illuminated from the backside of the substrate and receiving a bias to control a depletion region of the photodiode, and a transfer gate for transferring photoelectric charges from the photodiode to a sensing node of a pixel.

DESCRIPTION OF SPECIFIC EMBODIMENTS

Hereinafter, backside illuminated image sensors in accordance with embodiments of the present invention will be described in detail with reference to the accompanying drawings, so that those having ordinary skill in the art can easily implement the present invention.

Figure 1:
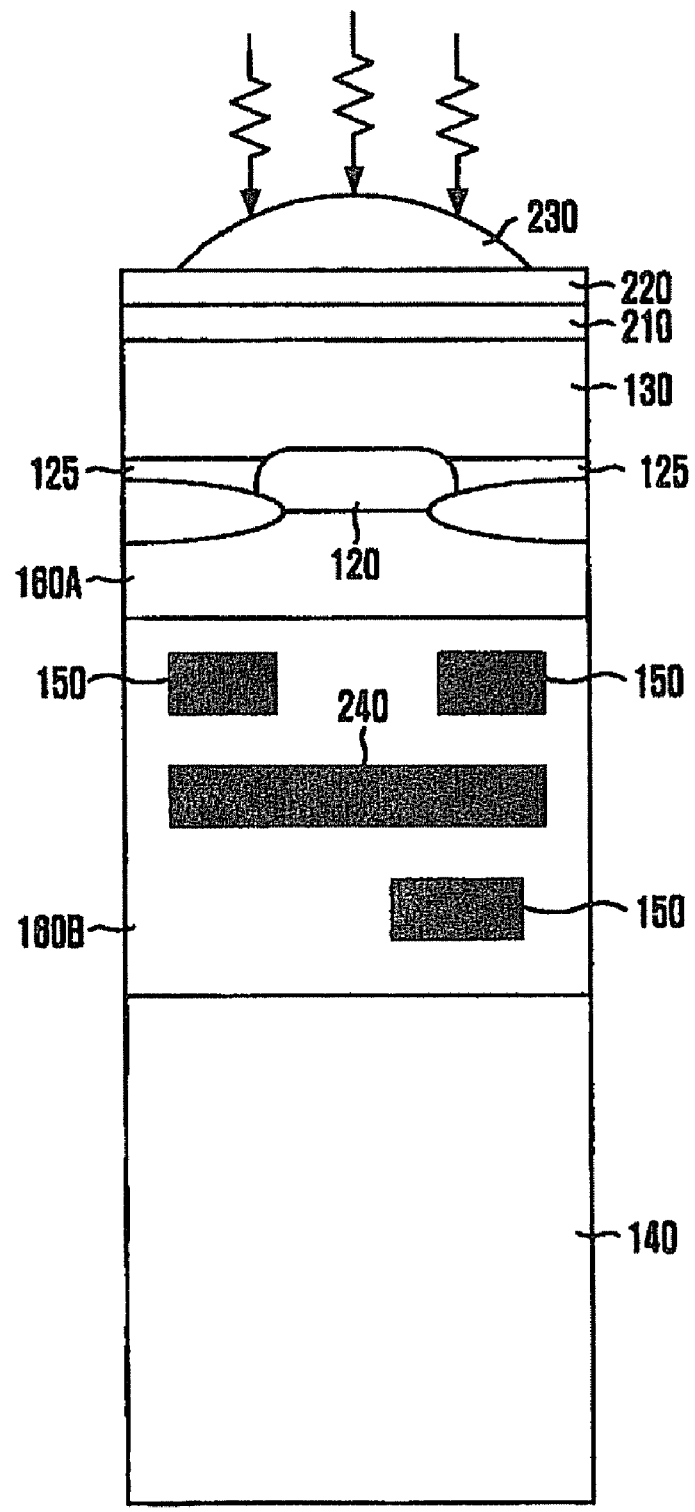
FIG. 1 is a sectional view of a conventional backside illuminated image sensor disclosed in US Patent Publication No. 2006-0068586.
Figure 2:
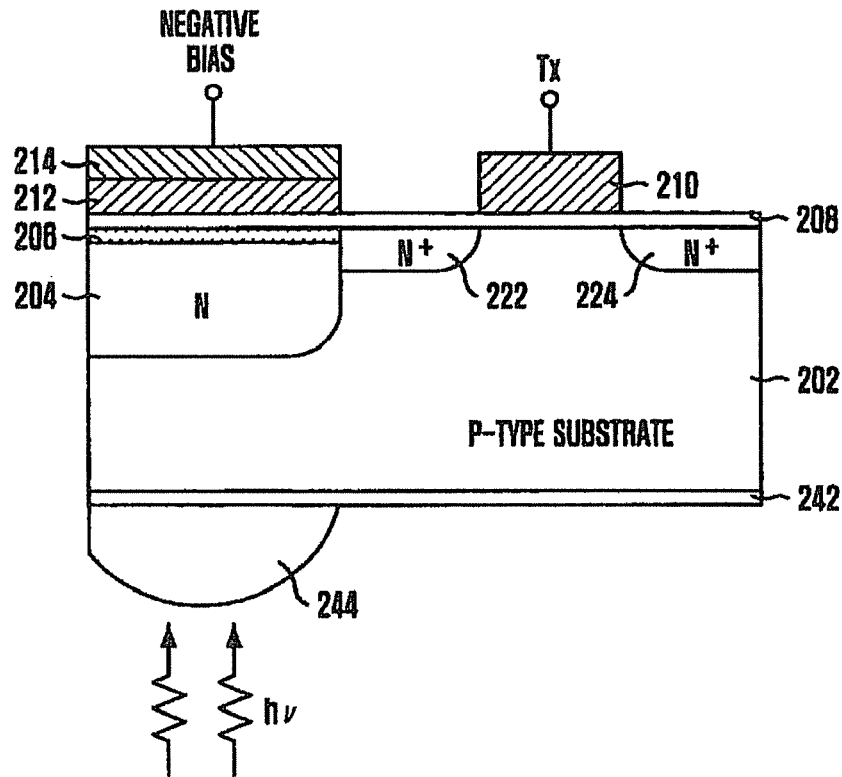
FIG. 2 is a sectional view of a backside illuminated image sensor in accordance with an embodiment of the present invention.

FIG. 2 is a sectional view of a backside illuminated image sensor in accordance with an embodiment of the present invention.

Referring to FIG. 2, a photodiode having an n-type doped region 204 and a p-type doped region 206 is formed below the top surface of a p-type silicon substrate 202. The p-type doped region 206 improves a dark current on the surface of silicon and is commonly referred to as a pinning layer. The photodiode may be configured only the n-type doped region 204, with the p-type doped region 206 being omitted.

The substrate 202 may employ another semiconductor material instead of silicon.

A microlens 244 is formed on the backside of the substrate 202. The microlens 244 converges light illuminated from the backside of the substrate 202 to the photodiode. An insulation layer 242 is formed between the microlens 244 and the substrate 202. The insulation layer 242 includes one of an oxide layer, a nitride layer, and a stack structure thereof. The oxide layer may include one layer selected from the group consisting of a borophosphosilicate Glass (BPSG) layer, a phosphosilicate glass (PSG) layer, a borosilicate glass (BSG), an un-doped silicate glass (USG) layer, a tetra ethyl ortho silicate (TEOS) layer, a high density plasma (HDP) layer, and a silicon oxide ($SiO_2$) layer. The nitride layer may include a silicon nitride ($Si_xN_y$) layer, where x and y are natural numbers, or a silicon oxynitride ($Si_xO_yN_z$) layer, where x, y and z are natural numbers. The insulation layer 242 can function as an anti-reflecting layer. A color filter for realizing a color image can be formed between the microlens 244 and the Insulation layer 242.

While logic circuits including a transfer gate 210 are formed on the substrate using a conventional method. Also, first and second reflecting gates 212 and 214 are further formed on the photodiode. The first and the second reflecting gates 212 and 214 have a stacked structure of a polysilicon layer and a metal silicide layer. The metal silicide layer may include a tungsten silicide layer. A metal layer such as a tungsten layer may be used instead of the metal silicide layer. Also, the reflecting gates may include only a metal silicide layer or a metal layer, without the polysilicon layer. Thus, the reflecting gates may be formed of a conductive material having high reflectivity.

The reflecting gates control the size of the photodiode depletion region by receiving a bias immediately before an integration time. That is, while the conventional image sensor determines a depletion region based on the processing conditions of the photodiode, the image sensor in accordance with the embodiment of the present invention can improve the cross-talk characteristic because the depletion region can be expanded up to near the backside of the substrate through the reflecting gates.

Due to the reflecting gates, the depletion region may be formed up to near the backside of the substrate. Because it is possible to accumulate photoelectric charges generated around the backside of the substrate when short-wavelength (blue wavelength) light is illuminated on the backside of the substrate, light sensitivity to short wavelengths is improved.

The bias applied to the reflecting gates may employ a negative bias generated using a circuit such as a negative charge pump. The negative charge pump may be integrated within the image sensor chip.

Since the reflecting gates include the metal silicide layer which can prevent light transmission and reflect light, signal loss of long-wavelength light illuminated from the backside of the substrate can be reduced. Accordingly, there is no need to provide a separate metal reflective layer at the top surface of the substrate, and there are no restrictions imposed on a metal layout.

Since the reflecting gates cover the photodiode, it protects the photodiode from plasma damage during etching of the gate and damage inflicted during other processes.

When the transfer gate 210 is turned on, the photoelectric charges accumulated in the photodiode are transferred to the sensing node of the pixel, that is, an N+ floating diffusion region 224. An N+ buffer region 222 is formed below the top surface of the substrate between the photodiode and an edge of the transfer gate in order to accumulate the photoelectric charges. The N+ buffer region 222 functions to improve photoelectric charge transfer efficiency and timing margin. The photodiode, with the N+ buffer region 222 being omitted, may be formed along the edge of the transfer gate. In this case, the photodiode region can be expanded by the amount that the N+ buffer region 222 would take up.

Figure 3:
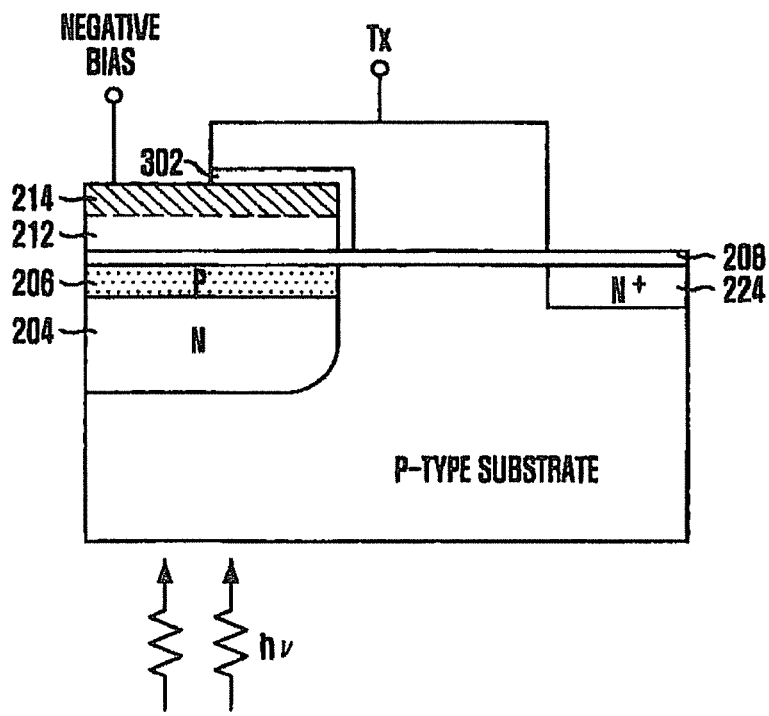
FIG. 3 is a sectional view of a backside illuminated image sensor in accordance with another embodiment of the present invention.

FIG. 3 is a sectional view of a backside illuminated image sensor in accordance with another embodiment of the present invention.

Like reference numerals refer to like elements in FIGS. 2 and 3, and description thereof will be omitted.

Referring to FIG. 3, first and second reflecting gates 212 and 214 and a transfer gate (Tx) partially overlapped, with an insulation layer 302 being interposed therebetween and the buffer region 222 of FIG. 2 being omitted.

As illustrated in FIG. 3, the buffering doped region is omitted, and the first and the second reflecting gate 212 and 214 and the transfer gate (Tx) are partially overlapped, whereupon space for the photodiode can be secured and the degradation of the photoelectric charge transfer efficiency and timing margin can be prevented.

As described above, the improved backside illuminated image sensor having the reflecting gates may be applied to both 4-transistor (4T) pixel and 3T pixel, which are well known to those skilled in the art. That is, the reflecting gates are added to a 4T pixel or a 3T pixel. Also, the image sensor may be applied to a scheme in which two or more photodiodes share one floating diffusion circuit and pixel circuit.

Also, a typical correlated double sampling (CDS) process for removing thermal noise in capacitor (kTC) noise may be applied to the above-described improved backside illuminated image sensor having the reflecting gates.

The present invention may be applied to a CCD image sensor as well as a CMOS image sensor manufactured using a CMOS fabrication technology.

By employing a backside illuminated structure, the present invention described above does not require consideration of a path for incident light when drawing up a layout for a logic circuit and metal lines at the front surface of the substrate.

Also, by controlling the width of a depletion region using a control bias in addition to an intrinsic potential of a photodiode, the present invention can improve photoelectric charge generation efficiency, light sensitivity to short wavelength, and cross-talk characteristic.

Furthermore, since the reflecting gates include a metal silicide layer or a metal layer as a gate material, signal loss of long-wavelength light illuminated from the backside of the substrate can be reduced. Thus, there is no need to provide a separate metal reflective layer on the front surface of the substrate.

Moreover, since the reflecting gates cover the top of the photodiode, the photodiode can be protected from damage during processing.

While the present invention has been described with respect to the specific embodiments, it will be apparent to those skilled in the art that various changes and modifications may be made without departing from the spirit and scope of the invention as defined in the following claims.

What is claimed is:

1. A method comprising:
providing light at a backside of a substrate;
reflecting the provided light onto a front side of a depletion region to generate and store a photoelectric charge; and
applying a bias signal at the front side of the depletion region to control the size of the depletion region.

2. The method of claim 1, wherein said applying a bias signal comprises applying the bias signal during an integration of the photoelectric charge.

3. The method of claim 1, wherein said reflecting the provided light comprises reflecting the provided light using a reflecting gate.

4. The method of claim 3, wherein the reflecting gate comprises a metal silicide layer.

5. The method of claim 1, further comprising using a photodiode at the backside of the substrate to form the depletion region.

6. The method of claim 5, wherein said using a photodiode at the backside of the substrate to form the depletion region comprises using a pinned photodiode.

7. The method of claim 1, further comprising integrating the photoelectric charge in the depletion region after said applying a bias signal.

8. The method of claim 6, further comprising transferring the photoelectric charge from the depletion region to a diffusion node.

9. The method of claim 1, wherein said applying a bias signal comprises applying a bias signal that extends the depletion region to a region proximate the backside of the substrate.

10. The method of claim 9, wherein said providing light at a backside of a substrate comprises providing short-wavelength light.

11. The method of claim 9, wherein said providing light at a backside of a substrate comprises providing blue light.

12. A method for operating a pixel of an image sensor, the method comprising:
    providing light at a backside of a substrate;
    using a reflecting gate disposed proximate a front side of the substrate to reflect the provided light onto a depletion region of a photodiode to generate and store photoelectric charges, wherein the photodiode is formed proximate a front surface of the substrate;
    receiving a bias signal at the reflecting gate to control the size of a depletion layer in the depletion region; and
    integrating the photoelectric charges in the depletion region after said receiving a bias signal.

13. The method of claim 12, wherein the bias signal comprises a negative bias voltage.

14. The method of claim 12, further comprising forming the reflecting gate to include a metal silicide layer.

15. The method of claim 14, wherein said receiving a bias signal comprises receiving a bias signal that extends the depletion region to a region proximate the backside of the substrate.

16. The method of claim 15, wherein said providing light at a backside of a substrate comprises providing short-wavelength light.

17. The method of claim 16, wherein said providing light at a backside of a substrate comprises providing blue light.

18. A method for forming a pixel of an image sensor, the method comprising:
    forming a photodiode proximate a front surface of a substrate;
    forming an insulation layer proximate on a back surface of the substrate;
    forming a color filter on the insulation layer;
    forming a microlens on the color filter;
    forming a reflecting gate on the front surface of the substrate proximate the photodiode; and
    forming an electrical connection between the reflecting gate and a bias voltage supply.

19. The method of claim 18, wherein said forming a color filter comprises forming a color filter that passes short-wavelength light.

20. The method of claim 18, wherein said forming a color filter comprises forming a color filter that passes blue light.

21. The method of claim 18, wherein said forming an insulation layer comprises forming an insulation layer from an anti-reflective material.

22. The method of claim 21, wherein said forming an insulation layer from an anti-reflective material comprises forming an insulation layer including a layer selected from the group consisting of an oxide layer, a nitride layer, and a stacked structure thereof.

23. The method of claim 21, wherein said forming an insulation layer from an anti-reflective material comprises forming an insulation layer including a layer selected from the group consisting of a borophosphosilicate glass (BPSG) layer, a phosphosilicate glass (PSG) layer, a borosilicate glass (BSG), an un-doped silicate glass (USG) layer, a tetra ethyl ortho silicate (TEOS) layer, a high density plasma (HDP) layer, and a silicon oxide ($SiO_2$) layer.

24. The method of claim 21, wherein said forming an insulation layer from an anti-reflective material comprises forming an insulation layer including a layer selected from the group consisting of a silicon nitride ($Si_xN_y$) layer, where x and y are natural numbers, and a silicon oxynitride ($Si_xO_yN_z$) layer, where x, y and z are natural numbers.

25. The method of claim 18, wherein said forming a reflecting gate comprises forming a stacked structure of a polysilicon layer and a metal silicide layer.

26. The method of claim 18, wherein said forming a reflecting gate comprises forming a layer of tungsten silicide.

27. The method of claim 18, further comprising forming a transfer gate overlapping the reflecting gate.

* * * * *

UNITED STATES PATENT AND TRADEMARK OFFICE
CERTIFICATE OF CORRECTION

PATENT NO. : 8,163,591 B2  Page 1 of 1
APPLICATION NO. : 12/956975
DATED : April 24, 2012
INVENTOR(S) : Park et al.

It is certified that error appears in the above-identified patent and that said Letters Patent is hereby corrected as shown below:

On the Face Page, in Field (75), under "Inventors", in Column 1, Line 3, delete "(JP)" and insert -- (KR) --, therefor.

In Column 6, Line 32, in Claim 23, delete "(Si0$_2$)" and insert -- (SiO$_2$) --, therefor.

Signed and Sealed this
Fourteenth Day of August, 2012

David J. Kappos
*Director of the United States Patent and Trademark Office*